United States Patent [19]

Inskip

[11] 3,982,941

[45] Sept. 28, 1976

[54] PHOTOPOLYMERIZABLE PASTE COMPOSITIONS AND THEIR USE

[75] Inventor: Harold Kirkwood Inskip, Newark, Del.

[73] Assignee: E. I. Du Pont De Nemours & Company, Wilmington, Del.

[22] Filed: Feb. 7, 1975

[21] Appl. No.: 547,958

Related U.S. Application Data

[62] Division of Ser. No. 357,525, May 7, 1973.

[52] U.S. Cl. .................................... 96/34; 96/36.2; 96/38.4; 96/86 P; 96/115 P; 96/115 R; 427/96; 427/226
[51] Int. Cl.² ..................... G03C 7/00; G03C 5/00; G03C 1/94; G03C 1/68
[58] Field of Search ............... 96/34, 115 P, 115 R, 96/36.2, 38.4, 86 P; 204/159.16, 159.22

[56] References Cited

UNITED STATES PATENTS

| | | | |
|---|---|---|---|
| 3,474,718 | 10/1969 | Guthrie et al............................ | 96/34 |
| 3,573,908 | 4/1971 | Minetti ................................... | 96/34 |
| 3,615,457 | 10/1971 | Seibert et al........................ | 96/35.1 |

*Primary Examiner*—Jack P. Brammer

[57] ABSTRACT

A photopolymerizable paste composition comprising film-forming solid inorganic particulate material, a polymer binder, unsaturated monomers, and an organic initiator dispersed in a hydrogenated terpene solvent provides a screen printable paste composition compatible with thick-film techniques used for fabricating electrically conductive and dielectric patterns and layers on substrates for electronic circuits.

6 Claims, No Drawings

PHOTOPOLYMERIZABLE PASTE COMPOSITIONS AND THEIR USE

CROSS-REFERENCE TO RELATED APPLICATION

This application is a division of my copending application Ser. No. 357,525, filed May 7, 1973.

BACKGROUND OF THE INVENTION

1. Field of the Invention

This invention relates to photosensitive compositions containing dispersed inorganic particulate material and particularly relates to photopolymer compositions containing such particulate matter. More particularly, it relates to photopolymerizable paste compositions suitable for screen printing and firing using thick film techniques.

2. Description of the Prior Art

Metallizing compositions containing finely divided noble metal or dielectric inorganic particulate material are well known for use in the art of preparing conductor and dielectric patterns or layers on substrates. Similarly, photoresist compositions are well known in the art for producing resist patterns on substrates and subsequent treatment of the substrate in the areas which have been imagewise exposed and developed. U.S. Pat. No. 3,573,908 discloses a process for the preparation of a ceramic substrate glaze using a mixture of a photoresist, a multicomponent oxide glaze frit, and a solvent. British Pat. No. 1,256,344 discloses applying a combination of a particulate metal, glass binder, photosensitive material, and solvent on the surface of the substrate and drying, exposing and developing it. The pattern provided is then fired to produce a printed circuit.

The photosensitive compositions containing inorganic particulate material of the prior art have not found wide acceptance in the electronic industry for fabricating electronic circuits, as they are not readily compatible with either thin film or thick-film techniques commonly employed for that purpose. The photopolymerizable paste compositions of this invention and their process of use by screen printing are readily compatible with commonly employed thick-film techniques and systems used for fabricating electronic circuits. The compositions of the invention due to the uniform dispersion and suspension of constituents may be prepared and packaged as paste, suitable for screen printing thus obviating the requirement that the circuit manufacturer become involved with the mixing of photoresist solutions, the dispersion of the inorganic particulate material in the resist composition, and complex coating of the composition on substrates. Additionally, screen printing the compositions provide for application on selected areas of substrate, thus substantially reducing the waste and increasing yields. This can be very important where the inorganic particulate material is a valuable noble metal, e.g., gold, silver, palladium or platinum.

SUMMARY OF THE INVENTION

According to the present invention, there is provided a photopolymerizable paste composition comprising a dispersion of finely divided inorganic particulate material, an unsaturated monomer, a polymeric binder, and a sensitizer in a hydrogenated terpene solvent.

Also provided is a process for preparing high resolution patterns or layers of sintered or fused films of inorganic material comprising the steps of screen printing the compositions of the invention on a substrate, imagewise exposing the screen printed pattern through a mask or transparency to actinic radiation to photopolymerize the exposed areas of the printed pattern, removing the unpolymerized areas, and firing the adherent polymerized exposed areas to produce sintered or fused films of the inorganic material and decompose or burn the photopolymerized monomer and polymeric binder. The resultant sintered or fused films may be electrical conductors, resistors or insulators having resistivities, e.g. from $10^{-3}$ up to greater than $10^{13}$ ohms/square, dependent on the selection of the inorganic particulate material.

The firing temperature is generally at least about 400°C.

The hydrogenated terpene solvents provide excellent solubility and uniform dispersion of the constituents of the paste composition, excellent wetting of the inorganic particulate constituent and the substrates, on which the paste is applied, and excellent drying characteristics. In combination with the other constituents the solvents provide a novel paste composition having the proper rheology for screen printing. Screen printing the photopolymerizable paste composition produces the smooth coatings required for fabricating thin multilayer electronic circuit elements, and eliminates the necessity of coating an entire substrate. The photopolymerizable paste composition may contain a high loading of particulate material, e.g., up to about 85% by weight of the composition, providing the required functionality of patterns or layers as conductive or dielectric elements in electronic circuits on firing. Additionally, the photopolymerizable paste may be photoimaged to produce high resolution, fine line paths, e.g., as fine as 1 mil and finer. If required more than one inorganic phase or layer may be successively applied and imaged while substantially maintaining the high resolution required.

DETAILED DESCRIPTION OF THE INVENTION

The photopolymerizable composition of this invention is specifically formulated as a paste. A paste may generally be defined as a soft plastic mixture or composition and may be specifically defined for the purpose of the invention as being semi-fluid and having sufficient fluidity to permit screen-printing and sufficient viscosity to substantially retain its form on application to a substrate. Paste compositions of this invention will have a viscosity in the range of about 5,000 to 1,000,000 centipoise as measured by a Brookfield viscometer at the application temperature, e.g., 23°C., and will preferably have a viscosity in the range 10,000 to 100,000 centipoise.

The inorganic particulate constituent of the paste composition includes the well known classes of inorganic materials which may be applied in a finely-divided state to form, on firing, an adherent sintered or fused film on a suitable substrate. These inorganic materials include metals, semi-metals, refractory inorganic compounds and combinations thereof. Specific examples of such materials are noble metals, inorganic oxides, glasses, sulfides, silicides, borides, and carbides. The inorganic particulates are incorporated in the paste composition in finely-divided form. In order to obtain the high resolution desired by photoimaging patterns or layers of the paste composition, the largest dimension of the majority of the finely-divided particulate material should not exceed the desired line or pattern length or width, and preferably the particle size will remain below about 20% of the resolution of the line or pattern length or width desired, e.g., for one mil lines, particle size should be less than 5 microns. Further, when the desired line resolution exceeds the desired resolution of the spacing between lines, the maximum particle size should be less than about 20% of the spacing between lines. Preferably at least 90% by weight of the finely-divided inorganic material should have a particle size of at least 0.5 micron. Spherical shaped particles are the preferred form of the finely-divided particulate matter. When the particulate inorganic solids are transparent to the actinic radiation, e.g., UV transparent glasses, the minimum particle size is not as critical, and a range of 0.01–40 microns may be used. A preferable range of particle sizes where the inorganic solids are not entirely opaque is from 0.01 to 15 microns.

The solvent, which is used as a vehicle for the other constituents of the photopolymerizable paste composition of the invention, must readily dissolve or suspend all the constituents including the inorganic solids. The solvent must be inert towards the constituents of the paste composition. Additionally, the solvent should be substantially removed from the paste composition by drying prior to photoimaging. Remaining solvent will cause the layer to be soft and adhere to the mask during exposure. Further, the solvent should be free of resinous high boiling components that would not be readily removable by drying, and which would prevent the thorough removal of the particulate material in the unimaged areas with the development solvent. The unpolymerized areas of monomer, polymeric binder and inorganic solids must be readily removable with suitable solvents. Therefore, the solvent of the paste composition must be essentially free of reactive groups which may interact with other constituents in unpolymerized areas or form resinous deposits on exposure to air, other processing environments or processing solutions.

The hydrogenated terpenes used in the compositions of the invention are prepared from terpenoids having carbon skeletons made up of from 2 to 8 isoprene units. Isoprene is an unsaturated $C_5H_8$ compound, specifically 2-methyl butadiene, and the terpenoids made up of multiple isoprene units also contain unsaturation, i.e., the $>C=C<$ group. Terpenes, particularly those containing two isoprene units and carrying hydroxyl functionality, have been widely used in formulating thick-film pastes because of their excellent combination of properties, e.g. suspending and wetting inorganic particulate material, rheology and evaporation rate. Unfortunately the basic terpene structural unit, having a readily polymerizable double bond, makes the unsaturated terpenoids unsuitable for use in the compositions of the invention. The unsaturation may interact with the other constituents of the paste compositions to produce undesirable materials. These unsaturated compounds also react with air to form gum or resins. These resins are not readily removable with development solvents used for removing the unpolymerized areas of the paste compositions. The unsaturation may also produce interaction with the other constituents or air and cause deleterious aging which renders the compositions unusable soon after preparation. Further, the low molecular resins or gums formed on exposure to air may remain partly unsaturated and can impede the desired photopolymerization of the polyfunctional monomers of the paste compositions. We have discovered that by elimination of the unsaturation present in the terpenoids, they may be used to provide highly stable paste compositions, which are not polymerized by air and provide excellent processability after extended storage times. Despite their conversion to a non-terpene structure these saturated compounds retain all the desirable characteristics of the unsaturated terpenoids. It is convenient to define these saturated compounds as "hydrogenated terpenes or terpenoids", although in fact they are no longer terpenes due to the absence of carbon-carbon unsaturation. The "solvent" may be prepared by the hydrogenation of unsaturated terpenes, having 10 to 40 carbon atoms in 2 to 8 repeating isoprene units.

The terpenes in turn may be readily prepared by organic synthesis techniques, as is well known in the art, or isolated as the natural oils extracted from plants. Representative oils are pinene, dipinene, lavender, rosemary, aniseed, wintergreen, terpentine and the like. These natural oils are essentially complex mixtures of various terpenoids. The preferred solvents for use in the paste compositions should have boiling points at atmospheric pressure of less than 300°C. and preferably less than 250°C. Preferred solvents are the hydrogenation products of terpenoids, terpenoid mixtures or terpenoid derivatives containing primarily two isoprene units. In the case of the natural oils the hydrogenation products may be distilled to eliminate essentially all of the product boiling above 300°C. and preferably at least above 250°C. These preferred terpenoids having two repeating isoprene units and 10 carbon atoms may be referred to as the $C_{10}$ terpenes. By definition, the $C_{10}$ terpenes are unsaturated, i.e., they contain the $>C=C<$ group, but they also may contain other functional substituents, e.g., OH, CHO, C=O, or derivatives of these functional substituents, e.g., OR, COOR, attached to the $C_{10}$ hydrocarbon skeleton. The hydrogenated $C_{10}$ terpenes are the preferred class of solvents for use in the paste compositions because a large number are liquids at room temperature. Hydrogenated terpenes which are solid at room temperature may also be used, where sufficient liquid monomers are available to convert the solid saturated compound to a liquid state in the paste composition, or where the paste composition is formulated and used at an elevated temperature, e.g., 60°C. thus melting the solid. Additionally, the solid phase hydrogenated terpenes may be mixed with lower melting point hydrogenated terpenes to produce a liquid phase at room temperature, i.e., by melting point depression. The *Handbook of Naturally Occurring Compounds*, Academic Press (1972) describes terpenoids from which the hydrogenated terpenoid solvents of the paste composition may be prepared.

The photopolymerizable monomeric constituent of the paste composition may comprise a polyfunctional aliphatic compound which can be photopolymerized by chain extension or addition polymerization when exposed to actinic radiation in the presence of a sensitizer. The monomeric constituent may comprise one or more acrylic monomers at least one of which has more than one

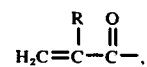

group R being H or CH₃.

Other suitable monomers may include, e.g., allylic or vinyl unsaturation. A preferred class of photopolymerizable monomers is the acrylates, including diacrylates, triacrylates, tetraacrylates, and methacrylates. Specific acrylates that have been found suitable are tetraethyleneglycol diacrylate, triethyleneglycol diacrylate, diethyleneglycol diacrylate, pentaerythritol triacrylate, 1,3-butanediol diacrylate, 1,4-butanediol diacrylate, 1,10-decamethyleneglycol diacrylate, 2,2-dimethylpropane diacrylate, 1,6-hexanediol diacrylate, pentaerythritol tetraacrylate, polyethyleneglycol diacrylate, 1,3-propanediol diacrylate, trimethylolpropane triacrylate, tripropyleneglycol diacrylate, ethylene diacrylate, and the corresponding methacrylates.

The sensitizer constituent of the paste compositions may be selected from the well known class of organic sensitizers including tertiary-butyl anthraquinone, benzoin methyl ether, 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 2-chloro-2-methylanthraquinone alphasulfonic acid, 3-chloro-2-methylanthraquinone alphasulfonic acid, 3-chloro-2-anthraquinone, retenequinone, 7,8,9,10-tetrahydronaphthacenequinone, and 1,2,3,4-tetrahydrobenz(a)anthracene-7,12-dione, and mixtures thereof. The amount of sensitizer may range from 0.01 to 2%, by weight, of the paste composition and preferably will be in the range 0.05 to 1% by weight of the paste composition.

Suitable polymeric binders for use in the paste composition are the polyacrylates and polymethacrylates. Particular advantage is obtained by the use of high molecular weight polymers. Polymeric binders with inherent viscosities in the range of 1 to 2 are preferred. Inherent viscosity is measured by the method described in "Condensation Polymers; By Interfacial and Solution Methods", P. W. Morgan, Interscience Publishers, New York (1965), Appendix B, at 465, using chloroform as the solvent at 25°C. Polymers having an inherent viscosity less than 1 result in poor adhesion of the paste composition to the substrate and inorganic particulate material retention during development. Polymers having an inherent viscosity greater than 2 make it difficult to obtain the proper viscosity of the paste composition for screen printing, and decrease the maximum loading of inorganic particulate in the paste composition. The binder should therefore preferably have a high molecular weight in the range of 200,000–500,000. Additionally, it must decompose or burn cleanly during firing and not produce a carbonaceous residue.

Optional ingredients may be included in the paste composition to improve adhesion, alter viscosity, modify rheological properties, aid in the dispersion of the inorganic solids or improve the efficiency of the development process, e.g., silanes, ionic and nonionic surfactants and soy bean lecithin are typical of such optional ingredients.

The photopolymerizable paste compositions will have the following percent of constituents, by weight:

Finely divided inorganic particulate 20 to 85,
photopolymerizable monomer 0.5 to 5.0,
sensitizer 0.01 to 2.0,
polymeric binder 1.0 to 15.0, and
saturated terpene solvent 10 to 75 and will preferably have the following percent of constituents, by weight:

finely-divided inorganic particulate material 30 to 80,
photopolymerizable monomer 1.0 to 3.0,
sensitizer 0.1 to 1.0,
polymeric binder 2.0 to 12.0, and
saturated terpene solvent 15 to 60.

The photopolymerizable paste compositions of the invention may be formulated by dissolving or suspending polymeric binder, monomer and sensitizer in the hydrogenated terpene solvent, mixing in the finely-divided inorganic particulate material and milling the composition to a paste on a three roll mill, such as an ointment mill. The photopolymerizable paste composition may be forced through a fine screen to remove undispersed particles. To insure uniform dispersion of all the constituents in the composition, a separate solution or suspension of the constituents may first be made using aliquot portions of the hydrogenated terpene solvent. The finely-divided inorganic particulate may be pretreated by a first dispersion in the solvent and dried and then redispersing the inorganic particulate in the combined aliquot portions in which the other constituents have first been dispersed. The entire formulation may then be milled and screened to provide the paste composition. Photopolymerizable paste compositions so prepared may be packaged in a tube or jar, which is opaque to actinic radiation. The packaged compositions are provided to electronic circuit fabricators ready for use in screen-printing machines, which are well known in the art of fabricating thick-film electronic circuits. The packaged photopolymerizable paste composition will remain stable for months. The paste compositions eliminate the mixing of photoresist solutions and dispersion of inorganic particulate by the circuits manufacturer. Additionally, the paste compositions as before stated are compatible with screen-printing techniques which are well known in the art. They eliminate the necessity for roll or spin coating by the circuit manufacturer of the substrate on which high resolution pattern or layers of conductive or dielectric material are to be photoimaged.

The photopolymerizable paste compositions of the invention may be applied to any suitable substrate, e.g., alumina, glass, barium, titanate, saphire, berylia, steatite fostorite, zircon, ferrites, and ferroelectric or semiconductor substrates, e.g., silicon or germanium, or temperature resistant plastics, e.g., polyimides or polysulfones. According to the process of the invention the polymerizable paste composition may be applied to a substrate by screen printing or stencilling either over the entire area of the substrate or on a selected area of the substrate, only slightly larger than the desired high resolution pattern or layer is to occupy. The printed pattern is then dried at a moderate temperature, e.g., 40°C. to 75°C. to evaporate solvent without significant loss of the other liquid constituents of the paste composition. The substrate having the desired pattern of the dried paste composition may then be placed in a vacuum frame. A mask or transparency bearing the high resolution pattern desired thereon, may be placed over the substrate. The subsequent application of a vacuum tends to reduce the concentration of polymerization inhibiting oxygen dissolved in the paste composition and provides intimate contact between the screen printed pattern and the mask. The applied vacuum should not exceed 100 torr and preferably will be in the range of 1 to 10 torr. The photopolymerizable compositions may then be imagewise exposed through the mask to actinic radiation for a sufficient period of time to cause photopolymerization of the exposed areas. The substrate, having the exposed photopolymerizable composition thereon, may be removed from the vacuum frame and washed with a suitable solvent to remove monomer, binder and inorganic particulate in the unexposed areas of the composition. Optionally, the photopolymerizable composition may be preexposed in air after screen printing on the substrate to consume or partially consume dissolved oxygen or other impurities in the composition which might inhibit polymerization.

Suitable sources of actinic radiation for photopolymerization composition are generally in the UV range, e.g., low, medium or high pressure mercury lamps, carbon arcs, xenon arcs, and xenon flash tubes. Air streams for circulating water may be provided to cool the substrate in the vacuum frame to prevent the photopolymer composition from adhering to the mask and eliminate any possibility of heat induced polymerization in the unexposed area of the composition. Suitable solvents for removing the unexposed areas include carbon tetrachloride, chloroform, isobutyl alcohol, trichloroethylene, perchloroethylene, and chlorinated fluorocarbons. Alternatively, the unexposed areas may be removed by a dry process, e.g., an air stream or a gentle mechanical abrasion such as brushing. The photopolymerized high resolution pattern may then be fired to burn or decompose the photopolymerized monomers and polymeric binder and to fuse the inorganic particulate matter to form a functional element on the substrate. Typically, the temperature of the substrate is brought from room to peak firing temperature in about 5 to 45 minutes. The peak temperature is maintained for a few minutes and the substrate is gradually returned to room temperature. Ventilation should be provided during firing to remove the organic decomposition products of the photopolymerized monomer and polymer binder. For the following examples, a "hydrogenated terpene" solvent was prepared by the hydrogenation of a mixture of alpha and beta terpineol. One gallon of this mixture was hydrogenated at 1,025 psi and 100°C. for 12 hours in a stirred autoclave with a Raney nickel catalyst. The cooled reaction product was filtered and the liquid was stored over Linde 4A molecular sieves for one week to remove byproduct water and then flashed distilled at atmospheric pressure. About 1,000 grams of material having a boiling point below 200°C. was discarded. Product boiling at 200°C. was collected and the distillation terminated. A residue of approximately 500 grams remained and was discarded. The inorganic frit used to bond the fired metallization to the substrate was prepared by ball milling a mixture of 270 g. glass, 230 g. bismuth oxide and 300 g. water for 12 hours, and then filtering the suspension and drying. The base compositions were prepared for the following examples by first dispersing the monomer, polymer and sensitizer in the above described solvent. The inorganic solid constituents were pretreated by dispersion in the solvent, dried, and redispersed with the monomer/binder/sensitizer dispersion in solvent, milled to form a paste on a three roll mill, and then screened.

EXAMPLE 1

A photopolymerizable paste composition of the invention was prepared according to the above procedure comprising the following constituents by weight:
  diethyleneglycol diacrylate/tetraethyleneglycol diacrylate (60/40 by weight) 0.72 parts,
  polyisobutyl methacrylate (inherent viscosity equal to 1.1 at 25°C. in chloroform) 1.49 parts,
  benzoin methyl ether 0.11 parts,
  finely divided gold powder (particle size of 0.4 to 4 microns, spherical particles) 25.0 parts,
  inorganic frit (finely divided powder having a particle size of less than 1 to 13 microns) 0.64 parts, and
  hydrogenated terpineol 8.94 parts.

The finely divided gold powder was produced by precipitation of gold chloride with potassium sulfite. The paste compositions were applied to a 96% alumina substrate by screen printing and dried to provide a non-tacky layer at 60°C. for 10 minutes. The weight of the dry coating was 44 milligrams per inch square. The alumina substrate, having the paste composition thereon, was imagewise exposed to a 250 Watt mercury lamp for 90 seconds with a 16 inch lamp to substrate distance. The unhardened paste composition was removed by development in perchloroethylene. The photopolymerized paste composition on the alumina substrate was then fired at 850°C. peak temperature for 4 minutes. The alumina substrate having a sintered film gold metallization thereon was cooled and examined. High resolution continuous one mil lines were produced having a sheet resistivity of 11.5 milliohms per square, with reference to the specific thickness of the gold metallization. Gold wire was readily bondable to the fused gold film using both thermocompression and ultrasonic techniques.

EXAMPLE 2

A photopolymerizable paste composition of the invention was prepared as described above having the following constituent parts by weight:
  diethyleneglycol diacrylate/tetraethyleneglycol diacrylate (60/40 by weight) 0.70 parts,
  polyisobutyl methacrylate (inherent viscosity equal to 1.1 at 25°C. in chloroform) 2.92 parts,
  benzoin methyl ether 0.10 part by weight,
  finely-divided gold powder (particle size of 0.4 to 4 microns, spherical particles) 25.0 parts,
  inorganic frit (finely divided powder, having a particle size of less than 1 to 13 microns) 0.64 part, and
  hydrogenated terpineol, 7.78 parts.

The paste composition was applied to a substrate imagewise exposed, developed and fired as recited in Example 1. The dry coating weight of the composition was 32 milligrams per inch square. High resolution 1 mil lines on 4 mil centers were obtained, having a resistivity of 11 milliohms per square with reference to specific thickness of the sintered gold film.

EXAMPLE 3

A paste composition of the invention was prepared as described above comprising the following constituents parts by weight:
  diethyleneglycol diacrylate/tetraethyleneglycol diacrylate (60/40 by weight) 0.15 parts, polyisobutyl methacrylate (inherent viscosity equal to 1.1 at 25°C. in chloroform) 0.42 parts,
benzoin methyl ether 0.023 parts,
finely divided gold powder (particle size of 0.4 to 4 microns, spherical particles) 7.41 parts,
inorganic frit 0.31 parts, to the particle shape, but highly resolved 1 mil lines were produced.

Example 7 illustrates the use of the compositions of the invention using a mixture of finely divided metal powders having a particle size $0.3 - 4\mu$ and spherical shape.

TABLE I

| EXAMPLE | INORGANIC SOLID | PARTICLE SIZE ($\mu$) | INORGANIC FRIT | METAL | MONOMER | BINDER | SENSITIZER | HYDROGENATED TERPINEOL | COATING WT. | EXP. TIME | RESIST. OHMS/SQ. |
|---|---|---|---|---|---|---|---|---|---|---|---|
| 4 | Glass | 0.1–2 | 6.5 |  | 0.52 | 1.4 | 0.078 | 5.67 | 14 | 20 |  |
| 5 | Platinum | 0.3–2 | 1.04 | 25 | 0.52 | 1.4 | 0.078 | 5.67 | 48 | 60 | 100 |
| 6 | Silver | 0.2–3 | 1.04 | 12 | 0.52 | 1.6 | 0.074 | 6.47 | 21 | 240 | 40 |
| 7 | Gold/Platinum (78.5/21.5) | 0.3–4 | 1.04 | 25 | 0.52 | 1.4 | 0.078 | 5.67 | 42 | 75 | 98 | hydrogenated terpineol 1.68 parts.

The paste composition was screen printed at 15/16 in.² pattern using a 196 mesh nylon screen onto a 1 in.² 96% alumina substrate. The paste composition was dried at 60°C. The dry coating weight of the pattern was 0.045 grams per inch square. The dry paste composition was imagewise exposed for 60 seconds to the radiation of a 250 Watt pressure mercury lamp located 16 inches above the substrate. Imagewise exposure was through a photoemulsion mask having a 50 × 200 mil pad and a series of lines 2 mils wide and separated by 3 mil spaces. The substrate having the dry paste and photoemulsion mask were exposed in a vacuum frame with the pressure reduced to 1–2 torr. The unhardened areas of the pattern were removed by stirring the substrate in a perchloroethylene bath and the photopolymerized areas were dried and fired as recited in Example 1. Inspection of the sintered gold metallization showed the 2 mil gold lines were highly resolved. The resistance of the 50 × 200 mil pad as measured by a 4 point probe milliohmmeter was 11.7 milliohms per square.

EXAMPLES 4–7

A photopolymerizable paste composition according to the invention was prepared comprising the constituent parts by weight listed in Table 1 according to the procedure recited above. Compositions were screen printable on a 96% alumina substrate as recited in Example 1, dried, imagewise exposed, developed and fired as recited in Example 1.

Example 4 demonstrates the ability of the composition to the invention to provide high resolution 1 mil lines on 4 mil centers using a finely divided glass having a particle size $0.1 - 2\mu$ as the inorganic particulate.

Example 5 illustrates the compositions of the invention using a UV opaque finely divided platinum powder having a particle size $0.3 - 2\mu$ to prepare a high resolution 2 mil lines on 5 mil centers.

Example 6 illustrates the compositions of the invention using finely divided silver powder having a particle size $0.2 - 3\mu$ of mixed spherical and platelet particles. Increased exposure time was required apparently due

I claim:
1. A process for preparing sintered or fused films of inorganic materials on substrates comprising the steps of:
   a. screen printing a paste composition comprising:
      1. about 20 to about 80 weight percent of finely divided inorganic material;
      2. about 0.5 to about 5 weight percent of at least one photopolymerizable monomer;
      3. about 0.01 to about 2 weight percent of organic sensitizer;
      4. about 1 to about 15 weight percent of polymeric binder, and,
      5. from 10 to about 75 weight percent of a substantially saturated hydrogenated solvent containing 10 to about 40 carbon atoms formed by the hydrogenation of a terpenoid solvent to form a film,
   b. imagewise exposing said film through a mask or transparency to actinic radiation to photopolymerize the monomers in the paste composition and cause hardening of the composition in the exposed areas,
   c. removing the unexposed and unhardened areas of said film from said substrate, and
   d. firing said film to decompose or burn the polymeric binder and photopolymerized monomers and sinter or fuse the inorganic particulate material to form functional electronic circuit elements.

2. The process of claim 1 wherein said inorganic particulate material comprises a finely divided noble metal powder.

3. The process of claim 2 wherein said inorganic particulate material additionally includes a glass frit.

4. The process of claim 3 wherein said inorganic particulate material additionally includes bismuth oxide.

5. The process of claim 1 wherein said inorganic particulate material is a dielectric material.

6. A fired article comprising a substrate having an adherent pattern of inorganic sintered or fused material thereon prepared by the process of claim 4.

* * * * *